United States Patent
Aoki

(10) Patent No.: US 7,526,697 B2
(45) Date of Patent: Apr. 28, 2009

(54) MEMORY TEST CIRCUIT AND METHOD

(75) Inventor: Yoshiyuki Aoki, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 206 days.

(21) Appl. No.: 11/242,059

(22) Filed: Oct. 4, 2005

(65) Prior Publication Data
US 2006/0085711 A1    Apr. 20, 2006

(30) Foreign Application Priority Data
Oct. 5, 2004    (JP)    ............................ 2004-292844

(51) Int. Cl.
*G01R 31/28* (2006.01)
*G11C 29/00* (2006.01)

(52) U.S. Cl. ...................................... 714/731; 714/718

(58) Field of Classification Search ................. 714/731, 714/718
See application file for complete search history.

(56) References Cited

U.S. PATENT DOCUMENTS

| | | | |
|---|---|---|---|
| 5,991,232 A | 11/1999 | Matsumura et al. | |
| 6,249,893 B1 * | 6/2001 | Rajsuman et al. | ........... 714/741 |
| 6,925,408 B2 * | 8/2005 | Premy et al. | ................. 702/120 |
| 7,149,944 B2 * | 12/2006 | Okawa et al. | ................ 714/738 |

FOREIGN PATENT DOCUMENTS

| | | |
|---|---|---|
| JP | 2000-137061 A | 5/2000 |
| JP | 2004-79032 | 3/2004 |
| KR | 1999-71400 | 9/1999 |

OTHER PUBLICATIONS

Chinese Office Action dated Oct. 17, 2008 with English-Language Translation.

* cited by examiner

*Primary Examiner*—James C. Kerveros
(74) *Attorney, Agent, or Firm*—McGinn IP Law Group, PLLC

(57) ABSTRACT

To test memories operating with different operational clocks and deal with a delay involved in testing a memory at a physically remote location. A memory test circuit of the present invention tests a processor core memory and a function-specific core memory with a processor core, and includes a clock selector receiving operational clocks for the processor core and for the function-specific core to select one of the two to be applied to the processor core, and a control unit supplying to the processor core, the operation clock for the processor core when testing the processor core memory, and the operational clock for the function-specific core when testing the function-specific core memory, by use of the selector. With this setting, it is possible to test a memory running at different operational clock and used by the function-specific core.

20 Claims, 4 Drawing Sheets

MEMORY TEST CIRCUIT AND METHOD

BACKGROUND OF THE INVENTION

1. Field of the Invention

The present invention relates to a memory test circuit and method, and more specifically to a memory test circuit and method for testing plural memories.

2. Description of Related Art

In recent years, an LSI is becoming more sophisticated. Along with this, its configuration is complicated. In particular, there has been developed a technique of collectively integrating necessary functional blocks into one chip. This requires higher intelligence and more complicated configuration.

A requisite memory capacity increases as LSI attains higher intelligence. In this case, a memory may be provided outside the LSI but is desirably provided inside the LSI in consideration of the transfer time and physical size.

However, an embedded memory has a problem that a failure is more likely to occur, which largely influences a yield of the LSI. Therefore, a reliable operation test of a memory is required. However, a memory test circuit is complicated as an operation speed of the LSI increases or the LSI becomes more complicated, so a memory test method requires a larger number of steps.

To overcome this problem, there has been proposed a memory test method capable of reducing circuit scale and the requisite number of steps for operation test of an LSI having plural memory banks (for example, see Japanese Unexamined Patent Publication 2004-79032). The test method disclosed in this publication executes a command to simultaneously write data to identical addresses in respective banks, and executes a command to simultaneously read data from such addresses to determine whether or not the simultaneously read data coincide with an expected value in a data determination part, thereby checking the normality of a memory.

However, the method disclosed in this publication cannot test operations of memories which run at different operational clocks at actual operation speeds, due to the difference in operational clock. It is also impossible to test a memory at a physically remote location because a delay occurs. Thus, testing such a memory requires a special circuit such as a BIST (built-in self test) and costs high.

SUMMARY OF THE INVENTION

A memory test circuit according to the present invention includes: a processor core memory; a function-specific core memory; a processor core executing test for the processor core memory and the function-specific core memory; and a clock selector selecting a clock to be applied to the processor core out of input operational clocks, and supplying an operational clock for the processor core when testing the processor core memory to the processor core, and supplying an operational clock for the function-specific core when testing the function-specific core memory to the processor core. According to this configuration, the processor core can operate in such a manner that switches between an operational clock at which the processor core basically operates, and an operational clock at which the function-specific core operates. That is, it is possible to test the processor core memory with the operational clock at which the processor core basically operates, and test the function-specific core memory at the operational clock at which the function-specific core operates. Hence, both the processor core memory and the function-specific core memory can be tested with actual operation speeds, thereby enhancing a reliability of a memory test. Besides, the test for the function-specific core memory, which has been hitherto performed by integrating a special circuit such as a BIST circuit, can be carried out using the processor core, thereby saving a cost. Moreover, a test program can be changed, making it possible to deal with a change in test method without reconfiguring the circuit.

The present invention provides a memory test method for testing a processor core memory and a function-specific core memory with a processor core, including: applying an operational clock of the processor core and an operational clock of the function-specific core to select a clock to be supplied to the processor core in accordance with a memory to be tested, out of the applied operational clocks; supplying the operational clock of the processor core, to the processor core when testing the processor core memory; and supplying the operational clock of the function-specific core, to the processor core when testing the function-specific core memory. With this configuration, the processor core can operate in such a manner that switches between an operational clock at which the processor core basically operates, and an operational clock at which the function-specific core operates. That is, it is possible to test the processor core memory with the operational clock at which the processor core basically operates, and test the function-specific core memory at the operational clock at which the function-specific core operates. Hence, both the processor core memory and the function-specific core memory can be tested with actual operation speeds, thereby enhancing a reliability of a memory test. Besides, the test for the function-specific core memory, which has been hitherto performed by integrating a special circuit such as a BIST circuit, can be carried out using the processor core, thereby saving a cost. Moreover, a test program can be changed, making it possible to deal with a change in test method without reconfiguring the circuit.

According to the present invention, it is possible to test memories running at different operational clocks, and besides to deal with a delay involved in testing a memory at a physically remote location.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
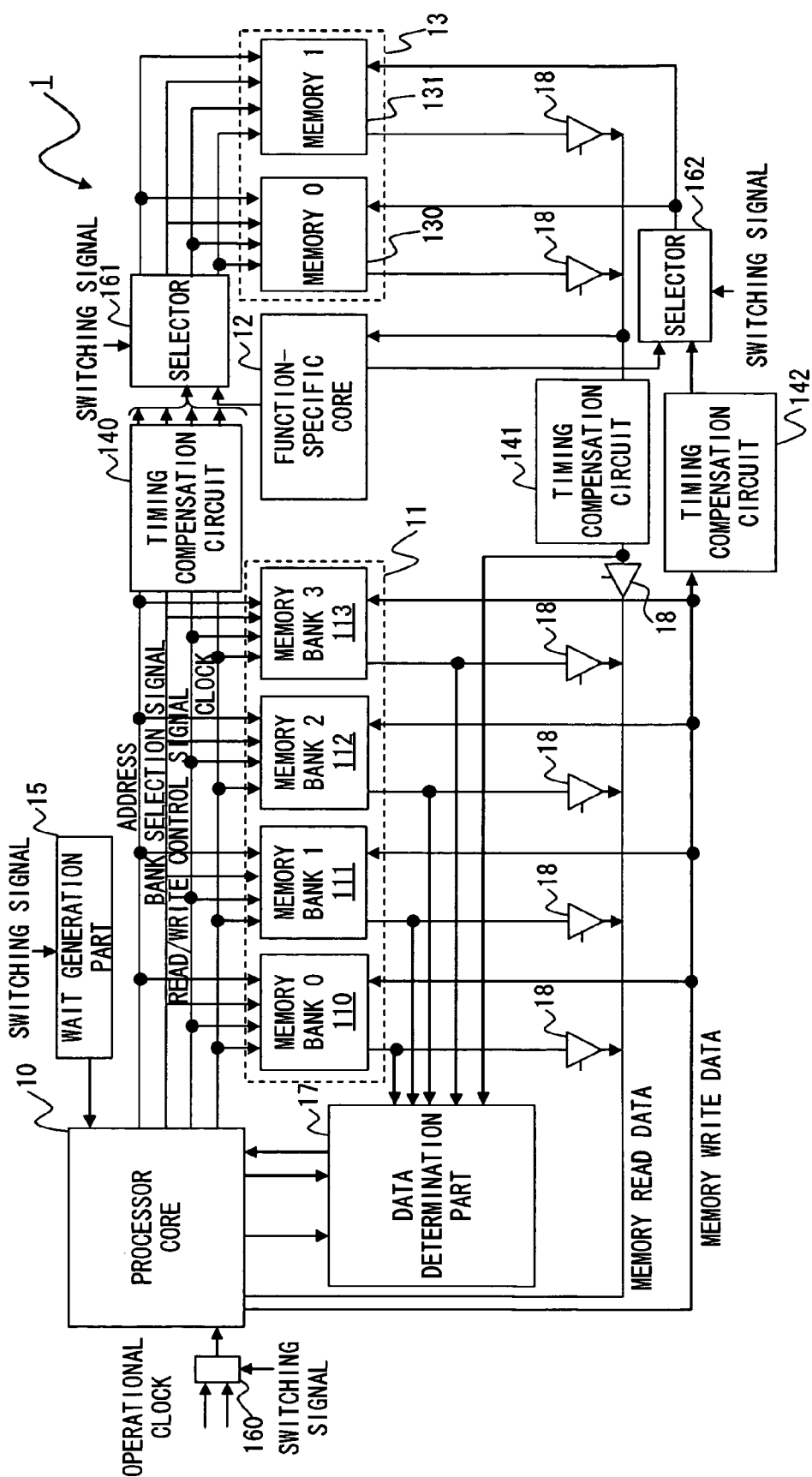
FIG. 1 is a block diagram showing the configuration of a memory test circuit according to the present invention.

FIG. 1 shows the overall configuration of a memory test circuit according to an embodiment of the present invention.

In FIG. 1, a memory test circuit 1 includes a processor core 10, a processor core memory 11, a function-specific core 12, a function-specific core memory 13, timing compensation circuits 140 to 142, a wait generation part 15, selectors 160 to 162, a data determination part 17, and a tri-state buffer 18.

The processor core 10 executes arithmetic processing in the memory test circuit 1. The processor core 10 is connected with the processor core memory 11 and operates in accordance with a clock frequency selectively applied from the operational clock selector 160. The processor core memory 11 is a storage unit used for arithmetic processing of the processor core 10, and is connected with the processor core 10. The processor core memory 11 is one of the memories tested by the memory test circuit 1. The processor core memory 11 is composed of plural banks inclusive of a memory bank 110, a memory bank 111, a memory bank 112, and a memory bank 113.

The function-specific core 12 is a special circuit for executing a specific function. The function-specific core 12 is connected with the function-specific core memory 13 via the control signal selector 161, and operates by use of the connected function-specific core memory 13 during the normal operation, however, the processor core 10 executes this operation during the memory test operation hence, the function-specific core 12 does not operate during the memory test. The function-specific core memory 13 is a storage unit for executing the function of the function-specific core 12, and is connected with the function-specific core 12 via the control signal selector 161. The function-specific core memory 13 is one of the memories tested by the memory test circuit 1. The function-specific core memory 13 is composed of plural memories inclusive of memories 130 and 131.

The timing compensation circuits 140 to 142 adjust timings at which the processor core 10 inputs/outputs data to/from the function-specific core memory 13, and are composed of a shift register, respectively. The timing compensation circuits 140 to 142 are provided in three portions inside the memory test circuit 1. The timing compensation circuit 140 is a control signal timing compensation circuit, the timing compensation circuit 141 is a memory read data timing compensation circuit, and the timing compensation circuit 142 is a memory write data timing compensation circuit.

The wait generation part 15 generates a wait signal, and supplies the generated wait signal to the processor core 10. The wait generation part 15 is only used for controlling a timing at which the processor core 10 tests the function-specific core memory 13.

The selectors 160 to 162 are circuits for selecting one of the two or more input signals and outputting the selected one. The selectors 160 to 162 are provided in three portions inside the memory test circuit 1, which correspond to the operational clock selector 160, the control signal selector 161, and the write data selector 162.

The data determination part 17 receives values supplied from each memory bank of the processor core memory 11 and values supplied from each memory bank of the function-specific core memory 13, and determines whether or not the values coincide with expected values. It is possible to check the normality of each memory based on the determination result. The determination result is sent to the processor core 10. Further, if it is determined that the memory is abnormal, the data determination part 17 may output an interruption signal to the processor core 10 to forcedly terminate the test operation.

The tri-state buffers 18 control output signals from memory. The tri-state buffers 18 control output signals in such a manner as to enable the output from a selected memory bank solely. In short, the tri-state buffers 18 output only signals from the selected memory bank, and do not output signals from the remaining memory banks. The tri-state buffers 18 are provided in seven portions inside the memory test circuit 1.

A description is next given of a processing flow of the memory test operation in the memory test circuit 1. The memory test processing is executed by the processor core 10. A program for the memory test processing is pre-installed in the memory test circuit 1 or read from the outside.

Figure 2:
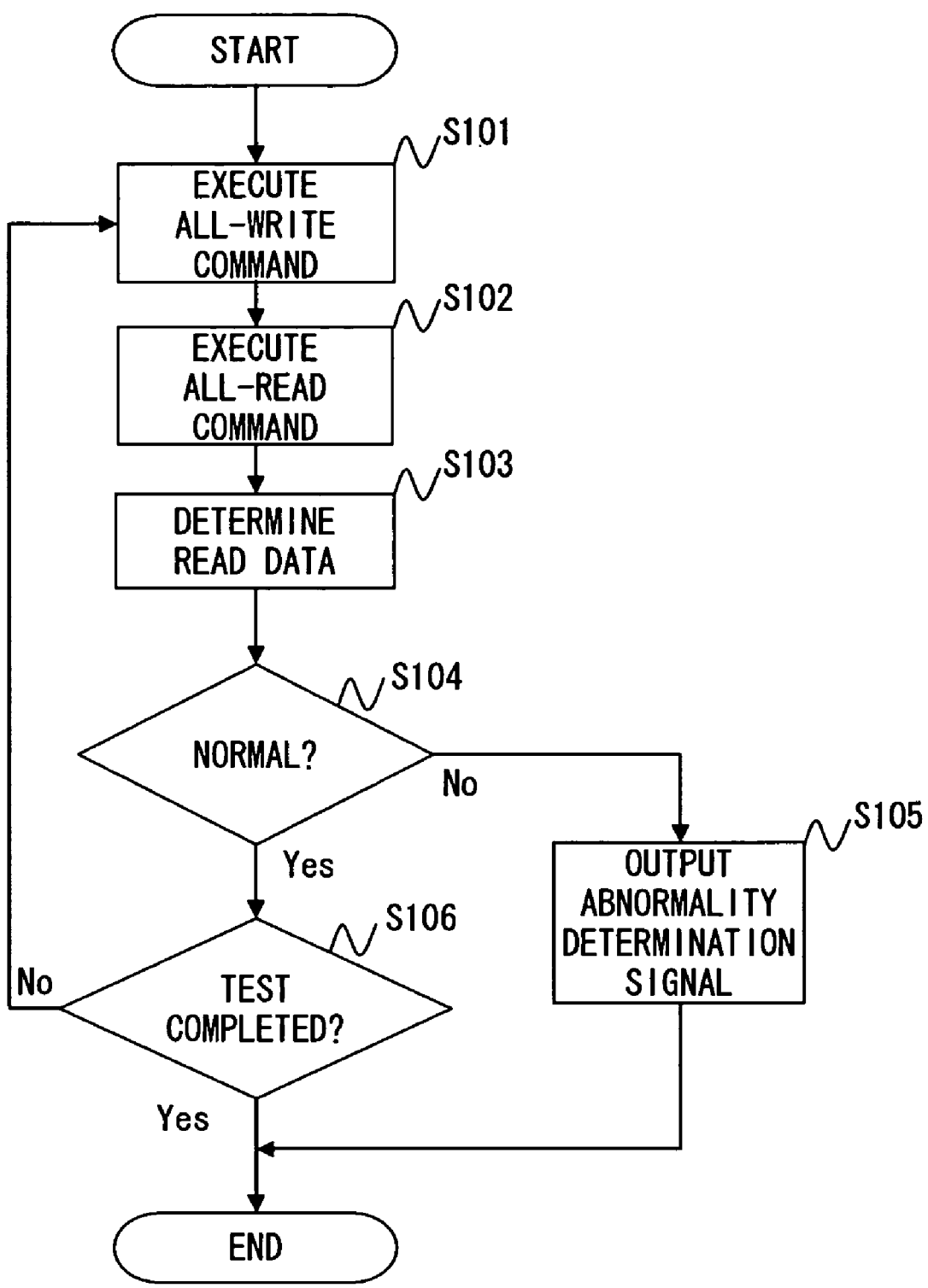
FIG. 2 is a flowchart showing a processing flow of a memory test method according to the present invention.

Referring now to a flowchart of FIG. 2, the memory test operation for the processor core memory 11 is first described. During the memory test operation for the processor core memory 11, the processor core 10 operates at an operational clock for a normal operation thereof. Thus, the operational clock selector 160 selects the operational clock for the normal operation of the processor core 10 out of the two input operational clocks, and supplies the selected one to the processor core 10 and each memory bank of the processor core memory 11.

The memory test processing is carried out in the following steps: data is first written to a memory and then read from the memory, and it is determined whether or not the read value coincides with an expected value. In the embodiment of the present invention, data are simultaneously written to and read from all the memory banks, thereby reducing the number of test steps and execution time. Hereinafter, detailed description is given about how to execute this.

First of all, the processor core 10 executes all-write command to write data to all the memory banks of the processor core memory 11 (S101). At this time, signals output from the processor core 10 to the processor core memory 11 are an address signal, a bank selection signal, a read/write control signal, and a memory clock.

The address signal is a signal for identifying an address of each memory to which a read or write command is directed. The number of bits for the address is set in accordance with a memory capacity. In the case of the usual write command, a memory bank is identified with reference to an address. In the case of the all-write command, an address common to the respective memory banks is output.

Regarding the bank selection signal, a signal "1" (standing for selection) is applied only to a bank to which data is to be written for a normal write command. In contrast, for the all-write command, a signal "1" is applied to all the banks.

The read/write control signal is a signal indicating whether to write or read data to/from each memory. Signals "0" and "1" are assigned to the read and write, respectively. Upon the execution of the write command, a value indicative of "write" is output.

After the completion of the output of the control signals from the processor core 10 to the processor core memory 11, write data as a value to be written is sent from the processor core 10 to each memory bank in the processor core memory 11. Receiving write data from the processor core 10, each memory bank of the processor core memory 11 stores the write data in synchronism with a memory clock.

Upon the completion of writing the input write data into each memory bank of the processor core memory 11, the processor core 10 executes an all-read command to read data from each memory bank of the processor core memory 11 (S102). At this time, each signal output from the processor core 10 to the processor core memory 11 is similar to the all-write command except that a value indicative of "read" is output as the read/write control signal.

Receiving the control signals from the processor core 10, each memory bank of the processor core memory 11 outputs read data that is a value stored in an address corresponding to an address signal included in the received control signals. In the case of the normal memory read command, the read data is output to the processor core 10; in the case of the all-read command for the memory test operation, each memory bank of the processor core memory 11 provides the read data to the data determination part 17. The read data may be applied to the processor core 10, and the processor core 10 may process the input read data depending on a test operation.

Receiving the read data from each memory bank of the processor core memory 11, the data determination part 17 determines whether or not the input read data coincides with an expected value (S103). The expected value used at this time is prestored in the data determination part 17. If there are plural expected values, they are respectively stored in registers in the data determination part 17, and it is determined which value stored in which register is used as an expected value based on an expected value register selection signal from the processor core 10.

If the determination result shows that the input read data coincides with the expected value (S104), the address of each memory bank of the processor core memory 11 is determined to be normal. Otherwise, the address portion is determined abnormal. When the address portion is abnormal, the data determination part 17 outputs a signal to that effect, to the processor core 10 (S105). In this case, the signal indicating the abnormal address may be used as a forced termination signal to terminate the test operation.

This process is carried out for all addresses of each memory bank of the processor core memory 11 (S106), thereby completing the test operation for the memories of the processor core memory 11. In this way, the respective banks are simultaneously subjected to memory test by use of the all-write command and all-read command, making it possible to reduce the number of test steps and test period.

Next, a description is given of the memory test operation for the function-specific core memory 13. The outline of this memory test operation, that is, the operation of reading/writing data to/from each memory using the all-write command and all-read command, and determining the abnormality with the data determination part 17 is the same as the memory test operation for the processor core memory 11. However, there are several points to be considered for connecting and operating the function-specific core memory 13, which is basically used for operating the function-specific core 12, with the processor core 10. One point is that the normal clock frequency is different between the processor core 10 and the function-specific core memory 13. Another point is that function-specific core memory 13 is located at a physically remote location from the processor core 10, so a wiring delay occurs. To that end, a measure against the problems should be taken.

In the case of testing the function-specific core memory 13, the processor core 10 is operated at the operational clock for the function-specific core 12. With this setting, the memory test can be effected with the actual speed, so the reliability of the test is enhanced. Thus, the operational clock selector 160 selects an operational clock for the function-specific core 12 out of the two input operational clocks, and applies the selected one to the processor core 10 and each memory of the function-specific core memory 13.

First, the processor core 10 executes the all-write command to write data to each memory of the function-specific core memory 13. At this time, the processor core 10 outputs control signals to each memory of the function-specific core memory 13. The control signals are output through the control signal timing compensation circuit 140 and the control signal selector 161.

The control signal timing compensation circuit 140 is a circuit to compensate for a delay resulting from such a wiring arrangement that the function-specific core memory 13 is physically remote from the processor core 10, and adjusts a timing for outputting the control signal using a shift register.

The control signal selector 161 selects a signal from the function-specific core 12 to output the signal to the function-specific core memory 13 during the normal operation, and selects a control signal from the processor core 10 to output the signal to the function-specific core memory 13 during the memory test operation for the function-specific core memory 13.

Further, a timing for outputting a control signal is adjusted by means of a shift resistor as for the input/output of the memory read data and the memory write data, using the memory read data timing compensation circuit 141 and the memory write data timing compensation circuit 142, respectively. Also, when the memory write data is output to the function-specific core memory 13, the write data selector 162 selects the write data from the processor core 10, and outputs the selected data to the function-specific core memory 13.

If the control signal output from the processor core 10 to the function-specific core memory 13 upon the data read and the data output from the function-specific core memory 13 to the processor core 10 is delayed from the output of the control signal and data from the function-specific core 12, it is necessary to delay the processor core 10 to take in data from the function-specific core memory 13. In such a case, the wait generation part 15 generates a wait signal and supplies the signal to the processor core 10. Receiving the wait signal from the wait generation part 15, the processor core 10 goes into wait state to delay the data input timing. It is determined how many wait cycles are set, by previously measuring the requisite number of wait cycles to set and output a wait signal corresponding to the number of wait cycles. In this connection, 1 cycle refers to 1 clock cycle of an operational clock applied to the processor core 10.

Figure 3:
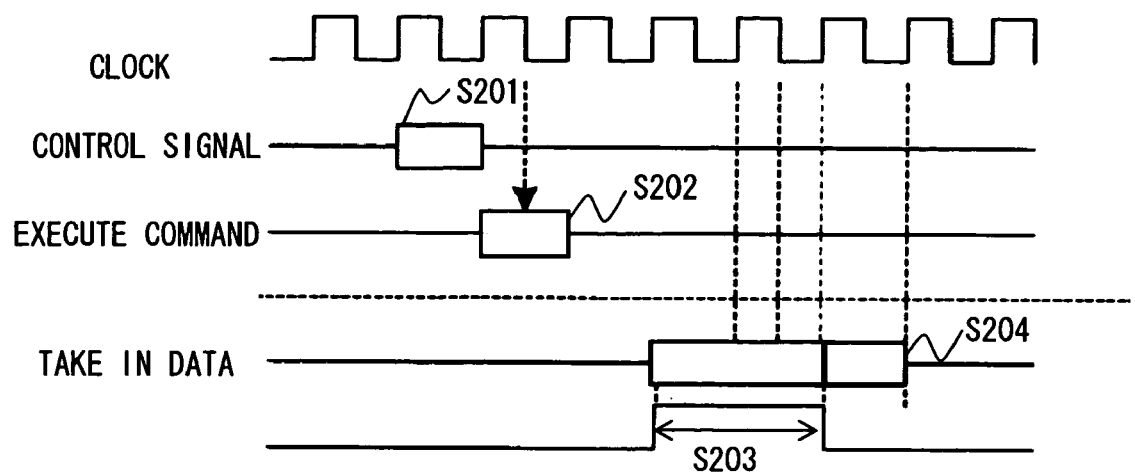
FIG. 3 is a timing chart showing the processing flow of the memory test according to the present invention.

A specific description is given of a processing flow of the timing control. FIG. 3 is a timing chart showing a processing flow of a memory test operation for the function-specific core memory 13. In the embodiment of the present invention, an explanation is made about the case where a period necessary for transmitting a signal from the processor core 10 to the function-specific core memory 13 is 1 clock cycle.

First, the case of executing the write command is described. The address signal and the read/write control signal are output from the processor core 10 to the function-specific core memory 13 (S201). This control signal is temporarily applied to the control signal timing compensation circuit 140.

The control signal timing compensation circuit 140 sends the input address signal and read/write control signal at a timing delayed for a predetermined number of cycles, to the function-specific core memory 13 (S202). How many cycles to be delayed can be determined in accordance with the signal transmission time.

The control signal timing compensation circuit 140 outputs the address signal and read/write control signal received at a timing of FIG. 3, with a delay of predetermined number of cycles, to the function-specific core memory 13. After that, the function-specific core memory 13 receives the address signal and read/write control signal from the timing compensation circuit 140. Thereafter, the write data signal from the processor core 10 is input through the memory write data timing compensation circuit 142. The memory write data timing compensation circuit 142 controls a timing to output the input write data signal to the function-specific core memory 13 similar to the control signal timing compensation circuit 140.

Receiving the address signal, the read/write control signal, and the write data signal from the processor core 10 through the control signal timing compensation circuit 140 and the memory write data timing compensation circuit 142, the function-specific core memory 13 determines that the write command is issued based on the read/write control signal, to rewrite value indicated by a write data signal to an address indicated by the address signal.

In this way, the processor core 10 is driven with a clock for the function-specific core 12 and the signal output timings is controlled through the control signal timing compensation circuit 140 and the memory write data timing compensation circuit 142, thereby making it possible to write data to the function-specific core memory 13 at a speed at which the function-specific core 12 is actually operated.

Subsequently, the case of executing the read command is described. A method of transmitting the address signal and read/write control signal is similar to that at the time of executing the write command, so its description is omitted here.

Receiving the address signal and read/write control signal through the control signal timing compensation circuit 140, the function-specific core memory 13 determines that the read command is issued based on the read/write control signal, and outputs a value stored at the address indicated by the address signal, to the data determination part 17.

The read data signal output from the function-specific core memory 13 is temporarily latched in the memory read data timing compensation circuit 141. The memory read data timing compensation circuit 141 adjusts the output timing for the read data signal to output the signal to the data determination part 17 similar to the control signal timing compensation circuit 140 and memory write data timing compensation circuit 142.

The memory test processing after the data determination part 17 receives the read data signal from the write data timing compensation circuit 142 is similar to the memory test processing for the processor core memory 11 except that a matching determination is carried out after the wait is reset, so its description is omitted here.

The memory test circuit 1 of this embodiment sends the read data signal output from the function-specific core memory 13, to the processor core 10 as well. This is for using the read memory data in the processor core 10 when the algorithm for the memory test operation is changed. Thus, it is possible to adapt to a memory test algorithm newly defined after the memory test circuit 1 is designed.

A method of inputting the read data signal output from the function-specific core memory 13 into the processor core 10 is described.

The processor core 10 receives the read data signal from the memory read data timing compensation circuit 141. At this time, a delay is involved in the signal transmission. A delay of 1 cycle is involved in the output of the control signal from the processor core 10 to the function-specific core memory 13 and involved in the input of the data from the memory read data timing compensation circuit 141 to the processor core 10; thus, the delay of 2 cycles in total occurs. Therefore, the processor core 10 receives the read data signal from the memory read data timing compensation circuit 141 with a delay of 2 cycles. (S203).

To that end, the wait generation part 15 generates wait signals corresponding to 2 cycles with a view to delaying the timing for 2 cycles, and outputs the signals to the processor core 10. At this time, the number of wait cycles may be changed by using the selector or program. Receiving the wait signal from the wait generation part 15, the processor core 10 waits for 2 cycles and then receives the read data signal from the memory read data timing compensation circuit 141 (S204). By setting a wait corresponding to the delay of data transmission in this way, the processor core 10 can receive the read data signal output from the function-specific core memory 13.

Figure 4:
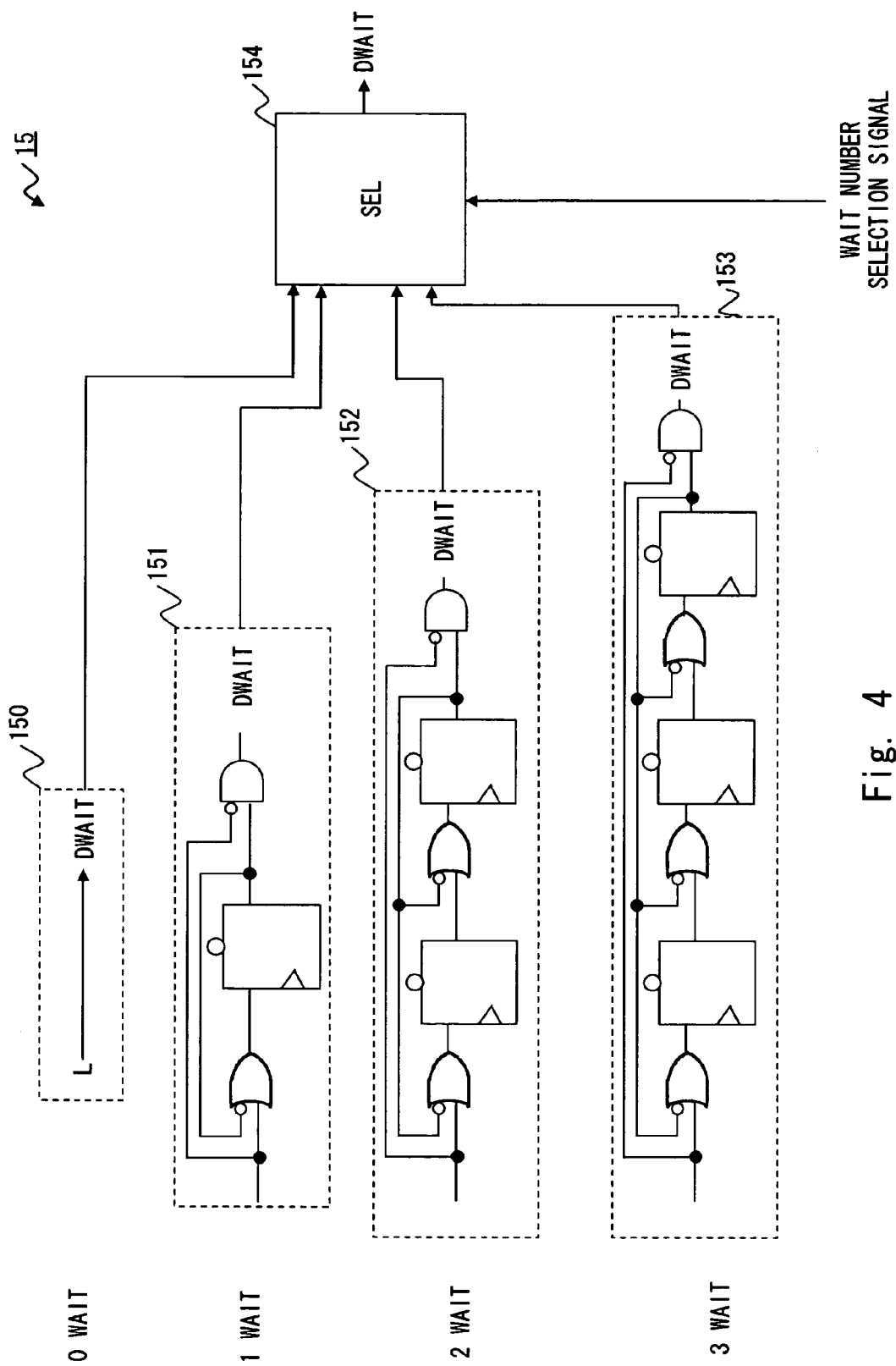
FIG. 4 is a circuit diagram showing the configuration of a wait generation part according to the present invention.

The wait generation part 15 is next described. FIG. 4 shows a circuit configuration example of the wait generation part 15. The wait generation part 15 includes a 0-wait generation circuit 150, a 1-wait generation circuit 151, a 2-wait generation circuit 152, and a 3-wait generation circuit 153; the respective wait generation circuits are connected with the selector 154. If a generation circuit capable of generating 4 or more wait cycles is necessary, this circuit may be similarly connected in parallel.

The wait generation part 15 inputs, if the number of wait cycles is fixed during the test operation, a wait number selection signal from the outside in advance, and selects a wait generation circuit in accordance with the input wait number selection signal. The wait generation part 15 outputs the wait signal input from the wait generation circuit to the processor core 10.

The number of wait cycles in the wait generation part 15 can be changed using a program. That is, a register for storing a wait preset value and a counter are provided inside the wait generation part 15, and the counter is incremented by 1 every cycle. When the counter value reaches the wait preset value stored in the register, it is determined that a prescribed wait time (wait cycles or times) passes, and the setting of wait time is cancelled. After that, the counter is reset to deal with the next wait cycle.

In this way, the processor core 10 can perform the memory test operation for the function-specific core memory 13. With this method, it is unnecessary to install special hardware upon testing a memory used by the function-specific core, thereby saving a cost. Further, in the case of installing the special hardware, the hardware should be reconfigured each time the test method is changed. According to the method of the present invention, however, the test method can be changed by changing a program, making it possible to flexibly test memories.

It is apparent that the present invention is not limited to the above embodiment that may be modified and changed without departing from the scope and spirit of the invention.

What is claimed is:

1. A memory test circuit, comprising:
   a processor core memory;
   a function-specific core memory;
   a processor core executing test for the processor core memory and for the function-specific core memory; and
   a clock selector for selecting a clock to be applied to the processor core out of input operational clocks, said clock selector supplying a first operational clock for testing the processor core memory, and supplying a second operational clock different from said first clock for testing the function-specific core memory.

2. The memory test circuit according to claim 1, further comprising a timing compensation circuit controlling data input/output timing between the processor core and the function-specific core memory.

3. The memory test circuit according to claim 2, further comprising a wait generation part applying a wait signal to the processor core in accordance with a delay between a data transmission time for the processor core and a data transmission time for the function-specific core, wherein the processor core performs processing in accordance with the delay based on the wait signal.

4. The memory test circuit according to claim 3, wherein the wait generation part can change a number of cycles in which a wait signal is output.

5. The memory test circuit according to claim 4, wherein the delay based on the wait signal comprises a predetermined number of clock cycles.

6. The memory test circuit according to claim 1, further comprising an input selector switching between the function-specific core and the processor core for applying a control signal and data to the function-specific core memory.

7. The memory test circuit according to claim 1, wherein the processor core memory and the function-specific core memory each have a plurality of memory banks,
the processor core executes an all-write command to simultaneously write data to all of the memory banks in a memory to be tested and an all-read command to simultaneously read data from all of the memory banks in the memory to be tested, and
the memory test circuit further comprises a data determination part simultaneously determining whether read data from all of the memory banks in a memory to be tested coincide with an expected value.

8. The memory test circuit according to claim 7, wherein the data determination part includes a plurality of registers storing expected values, and selects an expected value in accordance with the selected register based on an expected value register selection signal from the processor core.

9. The memory test circuit according to claim 1, wherein a test executed by the processor core for the processor core memory and for the function-specific core memory comprises a program which may be changed.

10. The memory test circuit according to claim 1, wherein
said first operational clock operates at a clock speed at which said processor basically operates, and
said second operational clock operates at a speed at which said function-specific core operates.

11. A memory test method for testing a processor core memory and a function-specific core memory with a processor core, comprising:
receiving a first operational clock for the processor core and a second operational clock different from said first clock for the function-specific core;
selecting a clock from said operational clocks to be supplied to the processor core in accordance with a memory to be tested;
supplying the first operational clock to the processor core for testing the processor core memory; and
supplying the second operational clock to the processor core for testing the function-specific core memory.

12. The memory test method according to claim 11, further comprising controlling data input/output timing between the processor core and the function-specific core memory for testing the function-specific core memory.

13. The memory test method according to claim 12, wherein the processor core executes a wait processing in accordance with a delay between a data transmission time for the processor core and a data transmission time for the function-specific core, for testing the function-specific core memory.

14. The memory test method according to claim 13, wherein the wait processing can change a number of wait cycles.

15. The memory test method according to claim 14, wherein the delay based on the wait signal comprises a predetermined number of clock cycles.

16. The memory test method according to claim 11, wherein the function-specific core and the processor core are switched upon a selection to apply a control signal and data to the function-specific core memory for testing the function-specific core memory.

17. The memory test method according to claim 11, wherein the processor core memory and the function-specific core memory each have a plurality of memory banks,
the processor core executes an all-write command to simultaneously write data to all of the memory banks in a memory to be tested and an all-read command to simultaneously read data from all of the memory banks in the memory to be tested, and
determining simultaneously whether read data from all of the memory banks in a memory to be tested coincide with an expected value.

18. The memory test method according to claim 17, wherein a plurality of expected values are set, and one expected value is selected in accordance with a signal from the processor core.

19. The memory test method according to claim 11, wherein a test executed by the processor core for the processor core memory and for the function-specific core memory comprises a program which may be changed.

20. The memory test method according to claim 11, wherein
said first operational clock operates at a clock speed at which said processor basically operates, and
said second operational clock operates at a speed at which said function-specific core operates.

* * * * *